Figure 1:
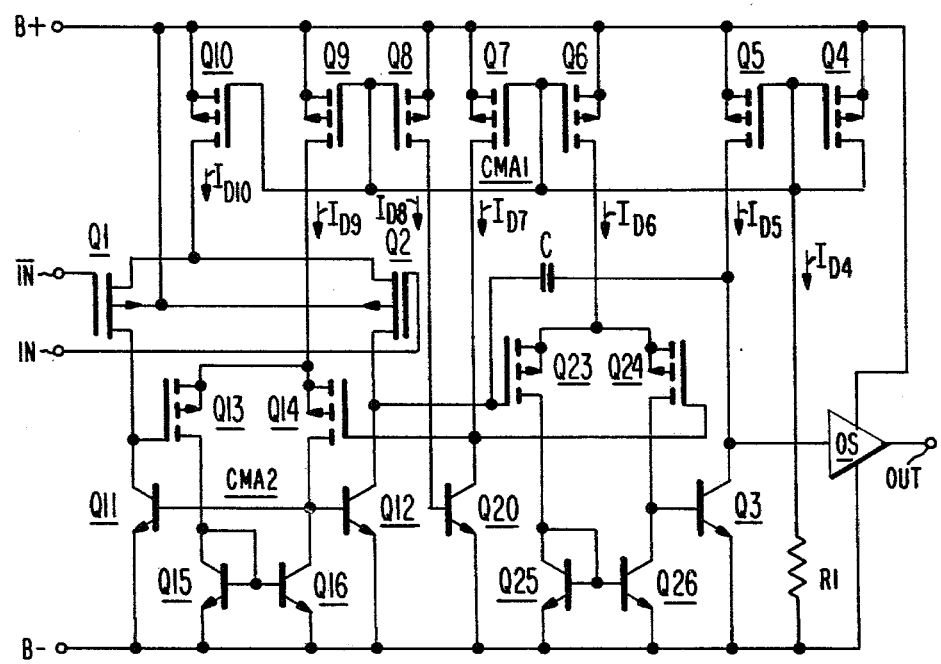

United States Patent [19]

Schade, Jr.

[11] 4,360,785

[45] Nov. 23, 1982

[54] TRANSISTOR AMPLIFIERS EXHIBITING LOW INPUT OFFSET POTENTIALS

[75] Inventor: Otto H. Schade, Jr., North Caldwell, N.J.

[73] Assignee: RCA Corporation, New York, N.Y.

[21] Appl. No.: 153,627

[22] Filed: May 27, 1980

[51] Int. Cl.³ .............................................. H03F 3/45
[52] U.S. Cl. ................................... 330/261; 330/253; 330/257
[58] Field of Search ..................... 330/253, 261, 257

[56] References Cited

U.S. PATENT DOCUMENTS

| | | | |
|---|---|---|---|
| 3,754,181 | 8/1973 | Kreitz et al. .......................... 323/1 |
| 3,953,807 | 4/1976 | Schade, Jr. .......................... 330/35 |
| 3,979,689 | 9/1976 | Schade, Jr. .......................... 330/30 |
| 4,068,184 | 1/1978 | Aziz Ahmed ...................... 330/257 |

OTHER PUBLICATIONS

L120 Dual Differential Input Amplifier Electronic Design 4, Feb. 1973, vol. 21, No. 4, p. A9.

*Primary Examiner*—James B. Mullins
*Assistant Examiner*—Gene Wan
*Attorney, Agent, or Firm*—E. M. Whitacre; P. J. Rasmussen; A. L. Limberg

[57] ABSTRACT

The input offset potential of a transistor amplifier exhibited by a grounded-emitter bipolar transistor or a grounded source enhancement-mode field effect transistor can be too large for certain applications. A preceding differential-input amplifier overcomes this problem.

10 Claims, 7 Drawing Figures

TRANSISTOR AMPLIFIERS EXHIBITING LOW INPUT OFFSET POTENTIALS

The present invention relates to transistor amplifiers exhibiting low input offset potentials.

A bipolar transistor connected in grounded-emitter amplifier configuration must be supplied with a sufficiently large emitter-to-base voltage ($V_{BE}$), somewhat more than half a volt in the case of a silicon transistor, in order to exhibit conduction through its principal current conduction path between its collector and emitter electrodes. Similarly, an enhancement-mode field effect transistor (FET) connected in grounded-source-amplifier configuration must be supplied with a source-to-gate voltage ($V_{GS}$) greater than a threshold voltage $V_T$ in order to exhibit conduction through its principal current path between drain and source electrodes. The value of $V_T$ depends upon the semiconductor material from which the FET device is constructed. In the remainder of this specification such transistors may be referred to generically and considered to have an "input electrode" corresponding to base or gate electrode, an "output electrode" corresponding to collector or drain electrode, and a "common electrode" corresponding to emitter or source electrode, depending on whether the transistor is a bipolar or a field effect transistor. And the generic term "enhancement-mode transistor" is extended to include bipolar transistors as well as FET's which conduct only if their gate and drain potentials are of the same polarity as referred to their source potentials.

The requirement for common-electrode-to-input electrode voltage greater than a certain value presents difficulties in some applications. These difficulties are overcome in the present invention by preceding the transistor with a differential-input amplifier having a non-inverting input connection with an output connection to the transistor input electrode, and with a inverting input connection biased respective to the transistor common electrode. An input signal is applied between the non-inverting input connection and the transistor common electrode.

Figure 2:
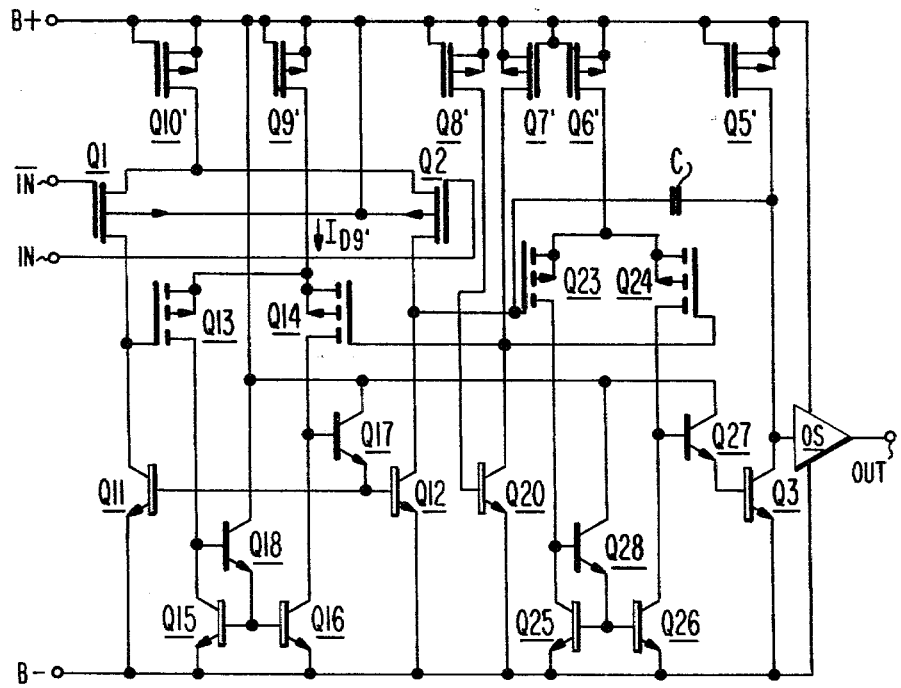

In the drawing:

FIGS. 1 and 2 are schematic diagrams of operational amplifiers including balanced to single-ended signal conversion circuitry wherein the present invention is employed; and FIGS. 3, 4, 5, 6 and 7 are schematic diagrams of modifications that can be made to the FIG. 1, FIG. 2, FIG. 3 or FIG. 4, FIG. 3 and FIG. 1 circuits, respectively, generating further embodiments of the present invention.

FIG. 1 shows an operational amplifier of a sort suited to construction in BiMOS monolithic integrated circuit technology, for example. This i-c technology has vertical-structure NPN transistors with appreciably large common-emitter forward current gains ($h_{fe}$'s), typically with a nominal value of 80–200, and with good p-channel metal-oxide semiconductor (MOS) FET's. Relatively positive and relatively negative operating potentials are applied to the supply terminals labeled B+ and B− respectively.

The inverting input terminal $\overline{\text{IN}}$ and non-inverting input terminal IN of the FIG. 1 operational amplifier connect to the gate electrodes of p-channel FET's Q1 and Q2, respectively. Q1 and Q2 are connected in long-tailed-pair configuration to receive a tail current $I_{D10}$ at their interconnected source electrodes. Q1 and Q2 supply respective drain currents $I_{D1}$ and $I_{D2}$ with respective common-mode components equal to half the tail current $I_{D10}$, upon which are superimposed respective differential-mode components appearing in response to the difference in the Q1 and Q2 gate potentials. A plural-output current mirror amplifier CMA1 comprises a p-channel master mirroring FET Q4 and p-channel slave mirroring transistors Q5, Q6, Q7, Q8, Q9 and Q10. Q4 is diode-connected and is in series with resistor R1 to conduct a current $I_{D4}$; the direct coupled drain-to-gate feedback in the diode connection of Q4 adjusts its source-to-gate voltage $V_{GS4}$ to support this value of drain current. $V_{GS4}$ applied as the respective source-to-gate voltages $V_{GS5}$, $V_{GS6}$, $V_{GS7}$, $V_{GS8}$, $V_{GS9}$ and $V_{GS10}$ of Q5, Q6, Q7, Q8, Q9 and Q10 conditions them to receive respective drain currents $I_{D5}$, $I_{D6}$, $I_{D7}$, $I_{D8}$, $I_{D9}$ and $I_{D10}$.

The balanced drain currents $I_{D1}$ and $I_{D2}$ are converted to a single-ended voltage by current mirror amplifier CMA2 cooperating with a Miller-effect dominant pole capacitor C for application to the base of a common-emitter NPN transistor Q3 in the intermediate stage of the operational amplifier as is described later. Q3 is collector-loaded to provide voltage drive to the input connection of an output-stage amplifier OS. Output stage OS conventionally comprises a voltage-follower stage and is shown having an output connection to the output terminal OUT of the operational amplifier.

The problem which the present invention is directed to solving is presented because of the desire to provide the operational amplifier with the capability of accommodating an input voltage at terminal IN or $\overline{\text{IN}}$ which swings negative with respect to B− operating voltage. To allow as negative an input voltage swing as possible, it is desired to bias the drains of Q1 and Q2 as close to B− operating voltage as possible. This means the quiescent emitter-to-collector voltages $V_{CE11}$ and $V_{CE12}$ of NPN transistors Q11 and Q12 in CMA2 should be not much larger than saturation value—e.g., about 100 mV.

Q11 and Q12 are the master and slave mirroring transistors, respectively, of CMA2. Direct-coupled collector-to-base feedback connection is provided for the master mirroring transistor Q11 to adjust its emitter-to-base potential $V_{BE11}$ to a value conditioning Q11 to conduct, as its collector current $I_{C11}$, the drain current $I_{D1}$ supplied from Q1; and $V_{CE11}$ is equal to $V_{BE11}$ plus or minus the translation in voltage afforded by this d.c. feedback connection. This d.c. feedback connection can be conventionally provided by direct connection of the master mirroring transistor collector to its base or by an emitter-follower transistor of the same conductivity type as the master mirroring transistor; however these connections would provide a $V_{CE11}$ much larger than the saturation value. In CAM2 a differential-input amplifier comprising p-channel FET's Q13 and Q14 in long-tailed pair configuration is used to provide d.c. collector-to-base feedback for Q11 that will determine its emitter-to-collector voltage $V_{CE11}$.

This differential-input amplifier including Q13 and Q14 is arranged to supply sufficient combined base currents to Q11 and Q12 to condition them to demand, during quiescent conditions, respective collector currents $I_{C11}$ and $I_{C12}$ respectively equal to $I_{D1}$ and to $I_{D2}$. This demand is made responsive to the source-to-gate potential $V_{GS13}$ of Q13 equalling the source-to-gate potential $V_{GS14}$ of Q14. This is implemented, for example, by using a simple current mirror amplifier connection of NPN transistors Q15 and Q16 as a balanced to single-ended signal converter for the drain currents $I_{D13}$ and $I_{D14}$ of Q13 and Q14. The nominal current gain G of CMA 2 equals the ratio of $I_{D14}$ to $I_{D13}$ if $V_{GS13}$ equals $V_{GS14}$; G and $I_{D14}/I_{D13}$ are normally chosen to be unity. It is preferable that FET Q9 of CMA1 supply a drain current $I_{D9}$ as tail current to the interconnected source electrodes of long-tailed pair Q13 and Q14 which is equal to the tail current $I_{D10}$ supplied to long-tailed pair Q1 and Q2. This results in the combined base currents of Q15 and Q16 equalling the combined base currents of Q11 and Q12 under the condition where the sum of $I_{C11}$ and $I_{C12}$ is adjusted to equal the sum of $I_{D1}$ and $I_{D2}$.

This occurs when $V_{GS13}$ equals $V_{GS14}$. The d.c. collector-to-base feedback at Q15 causes the excess of $I_{D13}$ over that required to supply the base currents of Q15 and Q16 to flow as collector current $I_{C15}$ in Q15. Current mirroring action between Q15 and Q16 causes the collector current demand $I_{C16}$ to equal $I_{D14}$ less the amount that is needed to supply the combined base currents of Q11 and Q12 in order to support collector currents equal to $I_{D1}$ and $I_{D2}$ respectively when $V_{GS1}$ equals $V_{GS2}$. (The matching of $V_{BE11} = V_{BE12}$ and $V_{BE15} = V_{BE16}$ under these conditions maintains the drain voltages of Q13 and Q14 equal, eliminating a source of small input offset voltage error between their gates.)

Biasing the gate of Q14 to a voltage equal to the saturation voltage of Q11 for maximum $I_{C11}$, or even for a collector current level slightly higher than maximum $I_{C11}$, will keep Q11 out of saturation. A variety of methods can be used to develop the gate bias for Q14—e.g., dividing down from $V_{BE}$ potential. FIG. 1 shows this potential being developed between the emitter and collector electrodes of an NPN transistor Q20 which is similar to Q11 and which is biased into saturation by the drain current $I_{D8}$ of Q8 being applied to its base. The saturation collector current $I_{C20}$ of Q20 is limited to a value $I_{C20-SAT}$ equal $I_{D7}$ provided from the drain of Q7 which serves as a constant-current-generator collector load for Q20. $I_{D7}$ is made at least as large as $I_{D10}$. Preferably, $I_{D7}$ is made somewhat larger than $I_{D10}$ to assure that Q1 and Q2 will not saturate when they are driven into respective full conduction and non-conduction. This condition arises when the input signal is rapidly changing with large amplitude thereby causing the operational amplifier to become overdriven in its attempt to follow the changing input signal. This condition is known as "slewing." (It is interesting to note that p-channel FET's Q13 and Q14 both operate unusually in the FIG. 1 operational amplifier in that their drain voltages are more positive than their gate voltages.)

The emitter-to-collector voltage $V_{CE12}$ of the slave mirroring transistor Q12 of CMA2 is regulated by the overall degenerative d.c. feedback connection (not shown) from terminal OUT to terminal $\overline{\text{IN}}$ of the FIG. 1 operational amplifier—e.g., as provided by a direct connection in voltage follower applications and by resistive potential divider in voltage amplifier applications. The quiescent value of $V_{CE12}$ will be regulated to to a value causing the Q23, Q24, Q25, Q26 amplifier to apply a current to the base of common-emitter amplifier transistor Q3 to bias it into conduction. In the specific configuration of FIG. 1, sufficient conduction of Q3 is that conduction necessary to make Q3 demand collector current $I_{C3}$ equal to the drain current $I_{D5}$ of Q5.

Because $I_{D5}$ is proportional to $I_{D10}$ (which is apportioned to flow to Q11 and Q12 as collector currents under quiescent conditions) the structure of Q3 may be dimensioned vis-a-vis Q11 and Q12 to exhibit a quiescent emitter-to-base voltage $V_{BE3}$ equal to the quiescent value of $V_{BE11}$ and of $V_{BE12}$.

The direct coupling path from the collector of Q12 to the base of Q3 should then exhibit the same potential offset as that from the collector Q11 to the bases of Q11 and Q12. This is provided for by the long-tailed pair connection of p-channel FET's Q23 and Q24 having the drain current $I_{D6}$ of Q6 applied to their interconnected sources as tail current. Q23 and Q24 have their respective drain currents $I_{D23}$ and $I_{D24}$ differentially combined for application to the base of Q3, this differential combining being done by the current mirror amplifier comprising NPN transistors Q25 and Q26. Succinctly stated, the differential-input amplifier including Q23, Q24, Q25 and Q26 provides direct coupling from its non-inverting input connection at the gate of Q23 to its output connection at the base of Q3 that is substantially the same as that direct coupling which the differential-input amplifier including Q13, Q14, Q15 and Q16 provides from its input connection at the gate of Q13 to its output connection at the bases of Q11 and Q12. Operation of these two differential-input amplifiers is analogous, with both having their inverting input connections offset from B— operating potential by a quiescent potential substantially equal to $V_{C20-SAT}$.

FIG. 2 shows an operational amplifier similar in many respects to that of FIG. 1, but adapted for construction in complementary-MOS (CMOS) integrated circuit technology. In this technology, in addition to N-channel and P-channel transistors with complementary conduction characteristics, two types of NPN bipolar transistor are available. The first type, shown with a rectangular body to which its electrodes connect (e.g., Q11, Q12), is a lateral-structure device with low common-emitter forward current gain ($h_{fe}$) and with uncommitted collector electrode. The second type, shown with a single stroke for its body (e.g. Q17, Q18), is a vertical-structure device with appreciably larger $h_{fe}$ but with a collector that must return to the most positive potential in the monolithically integrated CMOS structure, i.e. the B+ operating potential. A composite transistor structure that provides more design freedom can be obtained by operating a common-emitter amplifier transistor of the first type preceded in direct-coupled cascade connection by a common-collector amplifier transistor of the second type.

In the FIG. 2 operational amplifier common-emitter-amplifier NPN's Q11 and Q12 of the first type are preceded by common-collector-amplifier NPN Q17 of the second type. As a result, the voltage translation problem due to the cumulation of their respective $V_{BE}$ voltages, to which the present invention is directed, is present in even greater degree than in the FIG. 1 operational amplifier. Q13 and Q14 almost have to be enhancement-mode type to keep the tail current $I_{D9}$ reasonably small, while the source potentials of Q13 and Q14 are sufficiently positive relative to B— operating potential that their drains can be at $+2\ V_{BE}$ with respect to B— potential without interfering with the transistor operation of Q13 and Q14. Q23 and Q24 Q24 are similarly restricted. In addition, NPN transistors Q15 and Q16 of the first type are preceded in d.c. cascade by NPN Q18 of the second type; NPN Q3 of the first type is preceded in d.c. cascade by NPN Q27 of the second type; and NPN's Q25 and Q26 of the first type are preceded in d.c. cascade by NPN Q28 of second type. Q20 is an NPN of first type so its saturation voltage is related to that of Q11 and Q12.

CMOS construction can also offer the possibility of making field-effect transistors with different threshold voltages $V_T$ on the same monolithic integrated circuit, where ion implantation techniques are employed. Even enhancement- and depletion-mode FETs can be made in the same integrated circuit. This permits replacement of multiple-output current source CMA1 by depletion-mode FET's Q5', Q6', Q7', Q8', Q9' and Q10' each having its gate connected to its source for conditioning it to operate as a constant current generator.

Figure 3:
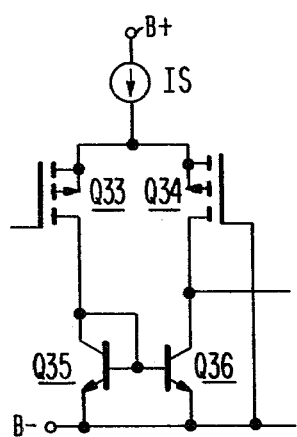
Figure 4:
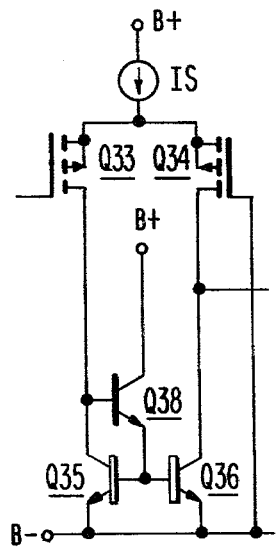

The ability to make transistors with different $V_T$'s permits the differential-input amplifier comprising Q13, Q14, Q15 and Q16 and that comprising Q23, Q24, Q25 and Q26 in FIG. 1 each to be modified to resemble the FIG. 3 differential-input amplifier comprising Q33, Q34, Q35 and Q36. Thus, Q7, Q8 and Q20 can be dispensed with. Using FETs with different $V_T$s' permits the differential-input amplifier comprising Q13, Q14, Q15, Q16 and Q18 and that comprising Q23, Q24, Q25, Q26 and Q28 in FIG. 2 each to be modified to resemble the FIG. 4 differential-input amplifier comprising Q33, Q34, Q35, Q36 and Q38. IS is the tail current source in FIGS. 3 and 4. Q34 is operated with its gate directly connected to B− operating potential because it and Q33 have the semiconductor regions under their respective gate electrodes doped for exhibiting different $V_T$'s, i.e. Q33 and Q34 exhibit exhibit relatively somewhat smaller $V_{GS33}$ and somewhat higher $V_{GS34}$ for any given source current level.

Figure 5:
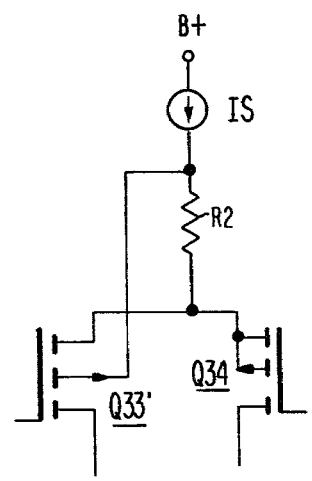

FIG. 5 shows how unbalanced differential amplifier behavior, similar to that exhibited by p-channel FET's Q33 and Q34 with different doping of the semiconductor regions under their gate electrodes, can be achieved by p-channel FET's Q33' and Q34 with similar doping. The bulk connection of Q33' is returned to more positive potential than that of the bulk connection of Q34. This potential difference is provided (for example) by the potential drop across resistor R2 inserted into the tail connection of Q33' and Q34 to conduct tail current from current source IS. (It is noted that Q1 and Q2 in FIG. 1 are also afforded modification of bulk potential to increase the range of common-mode voltage that can be accommodated at terminals IN and $\overline{\text{IN}}$.)

Figure 6:
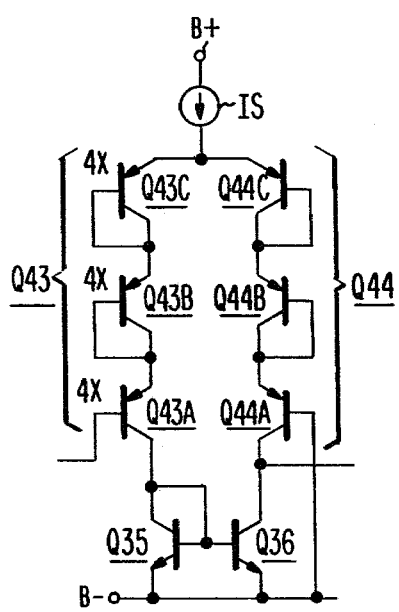

FIG. 6 illustrates how the unbalanced differential amplifier action could be provided in an all-bipolar-transistor integrated circuit, replacing Q33 and Q34 with composite transistor circuits Q43 and Q44, respectively. Q44 comprises a PNP transistor Q44A with a number of diode-connected PNP transistors Q44B, Q44C in its emitter connection; and Q43 comprises a PNP transistor Q43A with a similar number of diode-connected transistors Q43B, Q43C in its emitter connection. Each transistor in Q43 has a structure four times as large as its counterpart transistor or diode-connected transistor in composite transistor circuit Q43. As can be calculated from the well-known equation $V_{BE} = (kT/q)\ln(I_C/I_S)$ describing transistor action (where $V_{BE}$ is emitter-to-base voltage, k is Boltzmann's constant, T is temperature, q is the charge on an electron, $I_C$ is collector current, and $I_S$ is collector current at $V_{BE}=0$), about a 108 mV potential must appear between B− terminal and the base of Q34A to make the conduction of Q43 equal to that of Q44.

Figure 7:
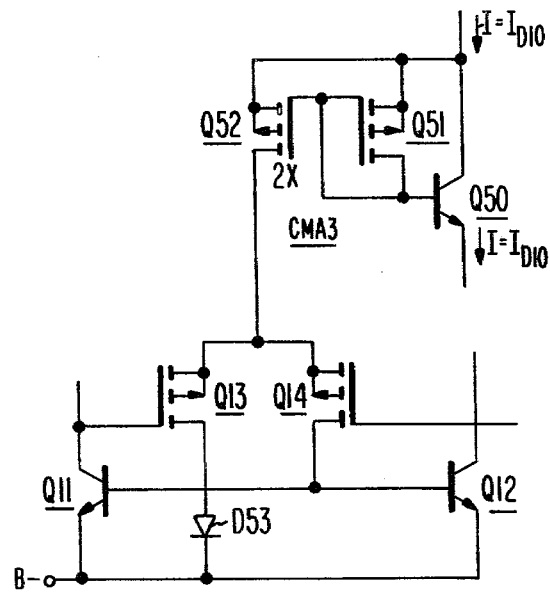

FIG. 7 shows a modification of the FIG. 1 operational amplifier wherein the balanced drain currents of Q13 and Q14 are not converted to single-ended form for application to the interconnected bases of Q11 and Q12. An NPN transistor Q50 is inserted to sense the tail current applied to the interconnected sources of Q1 and Q2. Its base current is applied as input current to a current mirror amplifier CMA3, including p-channel FET's Q51 and Q52 as master and slave mirroring transistors and having a current gain of minus two. The output current of CMA3, applied as tail current to the interconnected source electrodes of Q13 and Q14, is twice as large as the combined quiescent base currents of Q11 and Q12. As a result, the collector-to-base feedback of Q11 adjusts the circuit to apportion this tail current in equal portions as source currents to Q13 and Q14. D53 which may in fact correspond to diode-connected transistor Q15 can, as shown in FIG. 7, be inserted into the drain connection Q13 to make its drain voltage more like that of Q14 to eliminate a possible source of small input offset error between the gate electrodes of Q13 and Q14. The drain of Q13 may, however, connect directly to B− operating potential.

Other embodiments of the present invention will occur to one skilled in the art and armed with the foregoing disclosure. The differential amplifier in the d.c. collector-to-base feedback connections of Q11 can use a long-tailed pair connection of transistors of conductivity type similar, rather than complementary, to its conductivity type, for example. As a further example Q11, Q12, Q20, Q3 may be provided with emitter degeneration resistances without departing from the spirit of the present invention, particularly where these resistances are not significantly larger than the internal emitter resistances exhibited by the transistors to which they connect.

What is claimed is:

1. A current amplifier comprising:

first and second transistors of a first conductivity type, each having respective common and output electrodes defining the ends of its principal current conduction path and having a respective input electrode, wherein the potential between its common and input electrodes controls the conduction through its principal current conduction path, an input terminal to which the output electrode of said first transistor connects;

an output terminal to which the output electrode of said second transistor connects;

a common terminal to which the common electrodes of said first and second transistors connect; and means connecting the output electrode of said first transistor to the input electrodes of said first and second transistors for completing a direct-coupled degenerative feedback loop that adjusts the input electrode potentials of said first and second transistors respective to their common electrode potentials to condition said first transistor to conduct via its principal current conduction path at least a portion of any current applied between said common and input terminals, being improved in that the potential between the common and output electrodes of said first transistor is maintained smaller than the potential between the common and input electrodes of said first transistor, and to that end including a differential-input amplifier having an inverting input connection, having a non-inverting input connection connected to said input terminal, and having an output connection connected to the input electrodes of said first and second transistors, and including means for applying a biasing potential between the inverting input connection of said differential-input amplifier and said common terminal, said biasing potential having a magnitude no greater than the potential between the input and common electrodes of said first and second transistors.

2. A current amplifier as set forth in claim 1 wherein said differential-input amplifier comprises:

third and fourth transistors of the same conductivity type as each other, each having respective common and output electrodes defining the ends of its principal current conduction path and having a respective input electrode, the conductivity of the principal current conduction path of each of said third and fourth transistors being determined by the extent to which its common-electrode-to-input-electrode potential exceeds a first threshold voltage, the input electrodes of said third and fourth transistors being connected to the non-inverting input connection of said differential-input amplifier and to its inverting input connection, respectively;

means for applying tail current to an interconnection between the common electrodes of said second and third transistors for completing their connection in long-tailed-pair configuration; and balanced to single-ended signal converter means for converting the variations in the output electrode currents of said third and fourth transistors to single-ended form for application to the input electrodes of said first and second transistors.

3. A current amplifier as set forth in claim 1 wherein said differential-input amplifier comprises:

third and fourth transistors of the same conductivity type as each other, each having respective common and output electrodes defining the ends of its principal current conduction path and having a respective input electrode, the conductivity of the principal current conduction path of each of said third and fourth transistors being determined by the extent to which its common-electrode-to-input-electrode potential exceeds a first threshold voltage, the input electrodes of said third and fourth transistors being connected to the non-inverting input connection of said differential-input amplifier and to its inverting input connection, respectively, and the output electrode of said fourth transistor being connected to the input electrodes of said first and second transistors;

means for applying tail current to an interconnection between the common electrodes of said second and third transistors for completing their connection in long-tailed pair configuration; and means for applying operating potential to the output electrode of said third transistor.

4. A current amplifier as set forth in claim 1 wherein said means for applying a bias potential comprises:

means for applying the potential at said common terminal directly to the inverting input connection of said differential input amplifier—and wherein said differential-input amplifier comprises:

third and fourth transistors of the same conductivity type as each other, each having respective common and output electrodes defining the ends of its principal current conduction path and having a respective input electrode, the conductivity of the principal current conduction path of said third transistor being determined by the extent to which its common electrode-to-input-electrode potential exceeds a first threshold voltage, the conductivity of the principal current conduction path of said fourth transistor being determined by the extent to which its common-electrode-to-input-electrode potential exceeds a second threshold voltage differing from said first threshold voltage, the input electrodes of said third and fourth transistors being connected to the non-inverting input connection of said differential-input amplifier and to its inverting input connection, respectively, and the output electrode of said fourth transistor being connected to the input electrodes of said first and second transistors;

means for applying tail current to an interconnection between the common electrodes of said second and third transistors for completing their connection in long-tailed pair configuration; and means for applying operating potential to the output electrode of said third transistor.

5. A current amplifier as set forth in claim 3 or 4 including:

a current mirror amplifier having an input connection to the output electrode of said third transistor, having an output connection to the input electrodes of said third and fourth transistors, having a common connection, and having an input circuit between its input and common connections that is included in said means for applying operating potential to the output electrode of said third transistor.

6. A current amplifier as set forth in claim 3 wherein said third and fourth transistors are of a conductivity type complementary to said that of said first and second transistors.

7. A current amplifier as set forth in claim 4 wherein said third and fourth transistors are of conductivity type complementary to that of said first and second transistors and said second threshold voltage is larger than said first threshold voltage.

8. A current amplifier as set forth in claim 4 or 7 wherein said third and fourth transistors are field effect transistors with respective bulk electrodes and with respective gate, drain and source electrodes corresponding respectively to their respective input, output and common electrodes and wherein means biasing the bulk electrodes of said third and fourth transistors to different voltages are included for establishing said first and second threshold voltages at different values.

9. A current amplifier as set forth in claim 4 or 7 wherein said third and fourth transistors are field effect transistors with respective gate, drain and source electrodes corresponding to their respective input, output and common electrodes and with differently doped semiconductor regions under their gate electrodes wherein their principal current conduction paths are formed.

10. In combination with a differential-output amplifier supply first and second output currents each including at least a balanced signal component, and a source of current equal to the sum of the first and second output currents of said differential-output amplifier, a balanced-to-single-ended signal converter for developing a single-ended signal in response to said balanced signal components comprising:

input and output terminals to which the first and second output currents of said differential-output amplifier are respectively applied, said single-ended signal being developed at said output terminal;

a common terminal for receiving a reference potential;

first, second, third and fourth bipolar transistors of like conductivity type having respective emitter electrodes connected to said common terminal and having respective collector and base electrodes, the collector electrodes of said first and second transistors respectively connected to said input terminal and to said output terminal;

fifth and sixth, field-effect transistors of a conductivity type complementary to that of said bipolar transistors, having respective drain and gate electrodes and having respective source electrodes interconnected to receive said current equal to the sum of the first and second output currents of said differential-output amplifier;

means for applying the potential at said input terminal to the gate electrode of said fifth transistor;

means for applying a potential between the gate electrode of said sixth transistor and said common terminal;

an interconnection between the collector electrode of said third transistor and the drain electrode of said fifth transistor, which interconnection connects to the base electrodes of said third and fourth transistors; and an interconnection between the collector electrode of said fourth transistor and the drain electrode of said sixth transistor, which interconnection connects to the base electrodes of said first and second transistors.

* * * * *

UNITED STATES PATENT AND TRADEMARK OFFICE
CERTIFICATE OF CORRECTION

PATENT NO. : 4,360,785

DATED : Nov. 23, 1982

INVENTOR(S) : Otto H. Schade, Jr.

It is certified that error appears in the above-identified patent and that said Letters Patent is hereby corrected as shown below:

| | | |
|---|---|---|
| Col. 2, line 33 | - | "$\overline{IN}$", first occurrence thereof, should be --IN--; |
| Col. 2, line 33 | - | delete the hyphen at the end of the line. |
| Col. 4, line 64 | - | delete "Q24", second occurence thereof. |
| Col. 5, line 32 | - | "exhibit", first occurrence thereof, should be --respectively--. |
| Col. 5, line 67 | - | "Q34A" should be --Q43A--. |
| Col. 8, line 65 | - | "supply" should be --supplying--. |

Signed and Sealed this

Twenty-fifth Day of January 1983

[SEAL]

Attest:

Attesting Officer

GERALD J. MOSSINGHOFF

Commissioner of Patents and Trademarks